United States Patent
Ramanna et al.

(10) Patent No.: US 12,078,707 B2
(45) Date of Patent: Sep. 3, 2024

(54) SYSTEMS AND METHODS OF SIMULTANEOUS MULTI-SLICE ACQUISITION IN MAGNETIC RESONANCE IMAGING

(71) Applicant: GE PRECISION HEALTHCARE LLC, Wauwatosa, WI (US)

(72) Inventors: Sudhir Ramanna, Karnataka (IN); Ramesh Venkatesan, Karnataka (IN)

(73) Assignee: GE PRECISION HEALTHCARE LLC., Wauwatosa, WI (US)

( * ) Notice: Subject to any disclaimer, the term of this patent is extended or adjusted under 35 U.S.C. 154(b) by 29 days.

(21) Appl. No.: 17/716,672

(22) Filed: Apr. 8, 2022

(65) Prior Publication Data
US 2023/0324488 A1 Oct. 12, 2023

(51) Int. Cl.
*G01R 33/561* (2006.01)
*G01R 33/483* (2006.01)
*G06T 11/00* (2006.01)

(52) U.S. Cl.
CPC ..... *G01R 33/5617* (2013.01); *G01R 33/4835* (2013.01); *G06T 11/006* (2013.01)

(58) Field of Classification Search
CPC ............ G01R 33/5617; G01R 33/4835; G06T 11/006
See application file for complete search history.

(56) References Cited

U.S. PATENT DOCUMENTS

| | | | | |
|---|---|---|---|---|
| 5,548,216 | A * | 8/1996 | Dumoulin | G01R 33/4835 324/309 |
| 6,614,225 | B1 | 9/2003 | Feinberg | |
| 8,941,381 | B2 | 1/2015 | Feinberg et al. | |
| 9,689,948 | B2 * | 6/2017 | Ugurbil | G01R 33/5615 |
| 2014/0111201 | A1 * | 4/2014 | Kim | G01R 33/4835 324/309 |
| 2017/0102442 | A1 | 4/2017 | Setsompop et al. | |
| 2018/0306880 | A1 * | 10/2018 | Salerno | A61B 5/055 |

(Continued)

OTHER PUBLICATIONS

Souza, S. P., et al. "SIMA: simultaneous multislice acquisition of MR images by Hadamard-encoded excitation." J Comput Assist Tomogr 12.6 (1988): 1026-1030. (Year: 1988).*

(Continued)

*Primary Examiner* — Rishi R Patel
(74) *Attorney, Agent, or Firm* — Armstrong Teasdale LLP

(57) ABSTRACT

A magnetic resonance (MR) acquisition acceleration method is provided. The method includes, for each acquisition of a plurality of acquisitions, generating an excitation radio frequency (RF) pulse that excites a plurality of slices, applying, to a subject by an MR system, the excitation RF pulse, and acquiring MR signals of the plurality of slices. A number of slices in the plurality of slices is not a power of two, wherein generating an excitation RF pulse further includes modulating a base excitation RF pulse with a different modulation function during each acquisition. A number of acquisitions is equal to the number of slices, and MR signals from each acquisition are algebraic combinations of MR signals of individual slices. The method also includes reconstructing MR images of individual slices based on the MR signals from the plurality of acquisitions, and outputting the reconstructed images of the individual slices.

21 Claims, 9 Drawing Sheets

(56) References Cited

U.S. PATENT DOCUMENTS

2019/0154785 A1* 5/2019 Zhou ............... G01R 33/56316
2022/0130080 A1* 4/2022 Zeller ..................... G06T 5/10

OTHER PUBLICATIONS

"Simultaneous multislice (SMS) imaging techniques", Markus Barth, Felix Breuer, Peter J. Koopmans, David G. Norris, and Benedikt A. Poser, Magn Reson Med. Jan. 2016; 75(1): 63-81.
"Multifrequency Selective rf Pulses for Multislice MR Imaging", S. Muller, Magnetic Resonance in Medicine 6, 364-37 1 (1988).
"Simultaneous slice excitation and reconstruction for single shot EPI", Nunes RG, Hajnal JV, Golay X, Larkman DJ, ISMRM 14th Annual Meeting, 2006, p. 293.
"Fast submillimeter diffusion MRI using gSlider-SMS and SNR-enhancing joint reconstruction", Justin P. Haldar, Yunsong Liu, Congyu Liao, Qiuyun Fan, Kawin Setsompop, Magnetic Resonance in Medicine 2020;84:762-776. (DOI: 10.1002/mrm.28172).
"Simultaneous Image Refocusing (SIR): a New Approach to Multi-slice Mri", D.A. Feinberg, T.G. Reese, V.J. Wedeen, SMRM 8th Annual Meeting, 2000, p. 681.
"Phase-Offset Multiplanar (POMP) Volume Imaging: A New Technique", Gary H. Glover, PhD, Journal of Magnetic Resonance Imaging, vol. 1, No. 4, 1991, pp. 457-461.
"Variable-Rate Selective Excitation", Steven Conolly et al., Journal of Magnetic Resonance 78, 440-458, 1988.
"Variable-Rate Selective Excitation for Rapid MRI Sequences", Brian A. Hargreaves, Magnetic Resonance in Medicine 52:590-597, 2004.

* cited by examiner

| | H | G | F | E | D | C | B | A | |
|---|---|---|---|---|---|---|---|---|---|
| | 1 | 1 | 1 | 1 | 1 | 1 | 1 | 1 | S1 |
| | 1 | -1 | -1 | 1 | 1 | -1 | -1 | 1 | S2 |
| | -1 | -1 | 1 | 1 | -1 | -1 | 1 | 1 | S3 |
| | -1 | 1 | -1 | 1 | -1 | 1 | -1 | 1 | S4 |
| | -1 | -1 | -1 | -1 | 1 | 1 | 1 | 1 | S5 |
| | -1 | 1 | 1 | -1 | 1 | -1 | -1 | 1 | S6 |
| | 1 | 1 | -1 | -1 | -1 | -1 | 1 | 1 | S7 |
| | 1 | -1 | 1 | -1 | -1 | 1 | -1 | 1 | S8 |

FIG. 3A

| $-\omega_0$ | 0 | $\omega_0$ | |
|---|---|---|---|
| C | B | A | |
| 1 | 1 | 1 | S1 |
| -1 | -1 | 1 | S2 |
| -1 | 1 | 1 | S3 |

FIG. 3B 302-5

| | $-3\omega_0$ | $-\omega_0$ | 0 | $\omega_0$ | $3\omega_0$ | |
|---|---|---|---|---|---|---|
| | E | D | C | B | A | |
| | 1 | 1 | 1 | 1 | 1 | S1 |
| | 1 | 1 | -1 | -1 | 1 | S2 |
| | 1 | -1 | -1 | 1 | 1 | S3 |
| | 1 | -1 | 1 | -1 | 1 | S4 |
| | -1 | 1 | 1 | 1 | 1 | S5 |

FIG. 3C 302-6

| $-5\omega_0$ | $-3\omega_0$ | $-\omega_0$ | $\omega_0$ | $3\omega_0$ | $5\omega_0$ | |
|---|---|---|---|---|---|---|
| F | E | D | C | B | A | |
| 1 | 1 | 1 | 1 | 1 | 1 | S1 |
| -1 | 1 | 1 | -1 | -1 | 1 | S2 |
| 1 | 1 | -1 | -1 | 1 | 1 | S3 |
| -1 | 1 | -1 | 1 | -1 | 1 | S4 |
| -1 | -1 | 1 | 1 | 1 | 1 | S5 |
| 1 | -1 | 1 | -1 | -1 | 1 | S6 |

FIG. 3D

|   | -5ω₀ | -3ω₀ | -ω₀ | 0 | ω₀ | 3ω₀ | 5ω₀ |   |
|---|---|---|---|---|---|---|---|---|
|   | G | F | E | D | C | B | A |   |
|   | 1 | 1 | 1 | 1 | 1 | 1 | 1 | S1 |
|   | -1 | -1 | 1 | 1 | -1 | -1 | 1 | S2 |
|   | -1 | 1 | 1 | -1 | -1 | 1 | 1 | S3 |
|   | 1 | -1 | 1 | -1 | 1 | -1 | 1 | S4 |
|   | -1 | -1 | -1 | 1 | 1 | 1 | 1 | S5 |
|   | 1 | 1 | -1 | 1 | -1 | -1 | 1 | S6 |
|   | 1 | -1 | -1 | -1 | -1 | 1 | 1 | S7 |

302-7

SYSTEMS AND METHODS OF SIMULTANEOUS MULTI-SLICE ACQUISITION IN MAGNETIC RESONANCE IMAGING

BACKGROUND

The field of the disclosure relates generally to systems and methods of accelerated acquisition, and more particularly, to systems and methods of accelerated magnetic resonance (MR) acquisition.

Magnetic resonance imaging (MRI) has proven useful in the diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Compared to other imaging modalities, MRI is relatively slow, where an MRI scan may last one hour or more while a CT scan usually lasts less than 30 minutes. Therefore, accelerated acquisition is needed. Known accelerated acquisition methods are disadvantaged in some aspects and improvements are desired.

BRIEF DESCRIPTION

In one aspect, a magnetic resonance (MR) acquisition acceleration method is provided. The method includes, for each acquisition of a plurality of acquisitions, generating an excitation radio frequency (RF) pulse that excites a plurality of slices, applying, to a subject by an MR system, the excitation RF pulse, and acquiring MR signals of the plurality of slices. A number of slices in the plurality of slices is not a power of two, wherein generating an excitation RF pulse further includes modulating a base excitation RF pulse with a different modulation function during each acquisition. A number of acquisitions is equal to the number of slices, and MR signals from each acquisition are algebraic combinations of MR signals of individual slices. The method also includes reconstructing MR images of individual slices based on the MR signals from the plurality of acquisitions, and outputting the reconstructed images of the individual slices.

In another aspect, an MR acquisition acceleration method is provided. The method includes, for each acquisition of a plurality of acquisitions, generating an RF pulse that excites a plurality of slabs, applying, to a subject by an MR system, the excitation RF pulse, and acquiring MR signals of the plurality of slabs. The number of slabs in the plurality of slabs is not a power of two, wherein generating an excitation RF pulse further includes modulating a base excitation RF pulse with a different modulation function during each acquisition. The number of acquisitions is equal to the number of slabs, and MR signals from each acquisition are algebraic combinations of MR signals of individual slabs. The method further includes reconstructing MR images of individual slabs based on the MR signals from the plurality of acquisitions, and outputting the reconstructed images of the individual slabs.

DRAWINGS

FIG. 3A shows exemplary relationship between MR signals from individual acquisitions with MR signals from individual slices.

FIG. 3B shows exemplary relationship when the simultaneous multi-slice (SMS) factor is three.

FIG. 3C shows exemplary relationship when the SMS factor is five.

FIG. 3D shows exemplary relationship when the SMS factor is six.

DETAILED DESCRIPTION

The disclosure includes systems and methods of accelerated acquisition in magnetic resonance (MR) images of a subject. As used herein, a subject is a human, an animal, or a phantom, or part of a human, an animal, or a phantom such as an organ or tissue. Image acquisition is accelerated by exciting and acquiring multiple slices in one acquisition, unlike in conventional MR image acquisition, where one slice is acquired in one acquisition. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radiofrequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
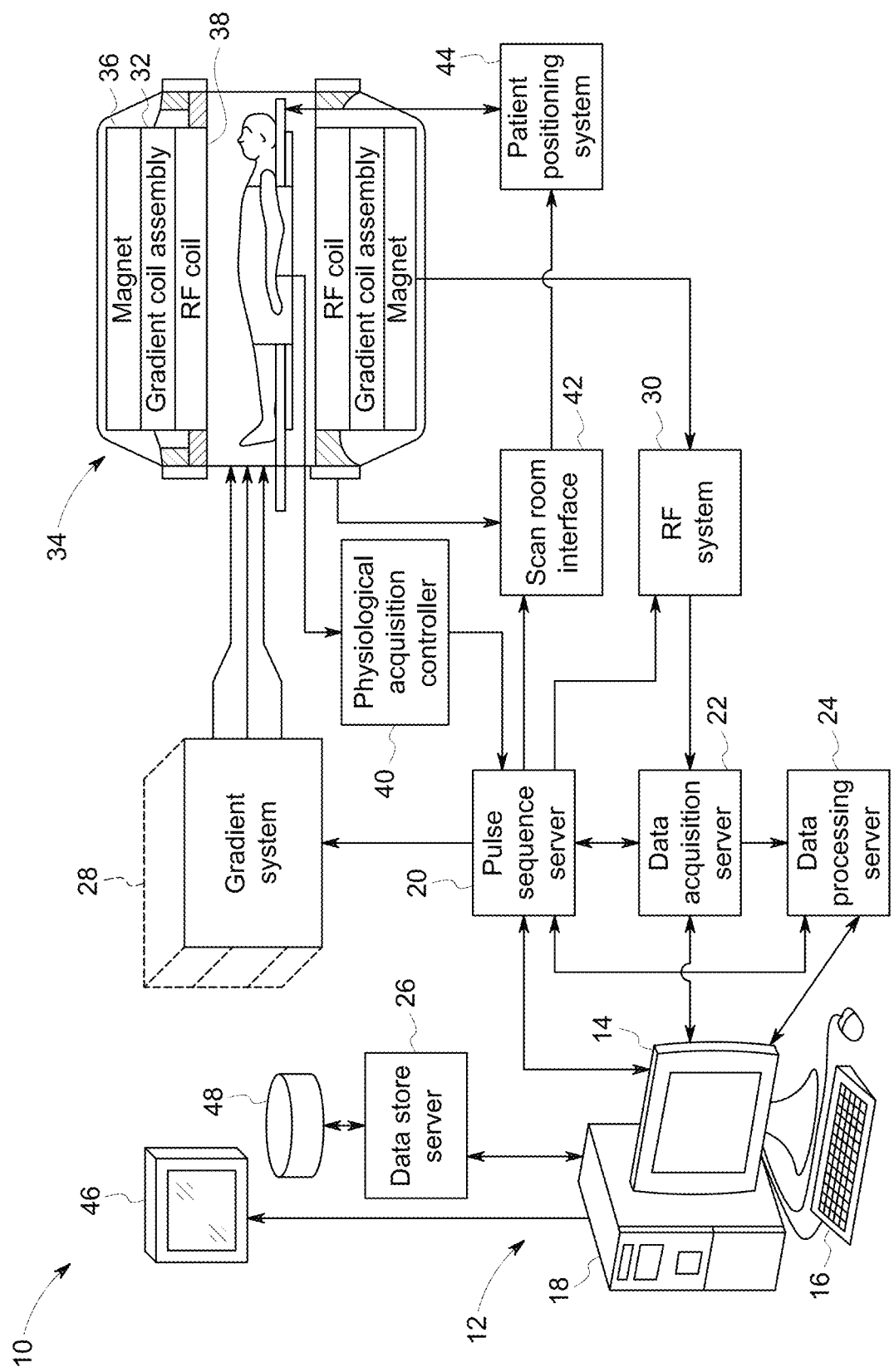
FIG. 1 is a schematic diagram of an exemplary magnetic resonance imaging (MRI) system.

FIG. 1 illustrates a schematic diagram of an exemplary MRI system 10. In the exemplary embodiment, MRI system 10 includes a workstation 12 having a display 14 and a keyboard 16. Workstation 12 includes a processor 18, such as a commercially available programmable machine running a commercially available operating system. Workstation 12 provides an operator interface that allows scan prescriptions to be entered into MRI system 10. Workstation 12 is coupled to a pulse sequence server 20, a data acquisition server 22, a data processing server 24, and a data store server 26. Workstation 12 and each server 20, 22, 24, and 26 communicate with each other.

In the exemplary embodiment, pulse sequence server 20 responds to instructions downloaded from workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. RF coil 38 is shown as a whole body RF coil. RF coil 38 may also be a local coil that may be placed in proximity to the anatomy to be imaged, or a coil array that includes a plurality of coils.

In the exemplary embodiment, gradient waveforms used to perform the prescribed scan are produced and applied to gradient system 28, which excites gradient coils in gradient coil assembly 32 to produce the magnetic field gradients $G_x$, $G_y$, and $G_z$ used for position-encoding MR signals. Gradient coil assembly 32 forms part of a magnet assembly 34 that also includes a polarizing magnet 36 and RF coil 38.

In the exemplary embodiment, RF system 30 includes an RF transmitter for producing RF pulses used in MR pulse sequences. The RF transmitter is responsive to the scan prescription and direction from pulse sequence server 20 to produce RF pulses of a desired frequency, phase, and pulse amplitude waveform. The generated RF pulses may be applied to RF coil 38 by RF system 30. Responsive MR signals detected by RF coil 38 are received by RF system 30, amplified, demodulated, filtered, and digitized under direction of commands produced by pulse sequence server 20. RF coil 38 is described as a transmitter and receiver coil such that RF coil 38 transmits RF pulses and detects MR signals. In one embodiment, MRI system 10 may include a transmitter RF coil that transmits RF pulses and a separate receiver coil that detects MR signals. A transmission channel of RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, RF system 30 also includes one or more RF receiver channels. Each RF receiver channel includes an RF amplifier that amplifies the MR signal received by RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M=\sqrt{I^2+Q^2} \quad (1);$$

and the phase of the received MR signal may also be determined as in Eq. (2) below:

$$\varphi = \tan^{-1}\left(\frac{Q}{I}\right). \quad (2)$$

In the exemplary embodiment, the digitized MR signal samples produced by RF system 30 are received by data acquisition server 22. Data acquisition server 22 may operate in response to instructions downloaded from workstation 12 to receive real-time MR data and provide buffer storage such that no data is lost by data overrun. In some scans, data acquisition server 22 does little more than pass the acquired MR data to data processing server 24. In scans that need information derived from acquired MR data to control further performance of the scan, however, data acquisition server 22 is programmed to produce the needed information and convey it to pulse sequence server 20. For example, during prescans, MR data is acquired and used to calibrate the pulse sequence performed by pulse sequence server 20. Also, navigator signals may be acquired during a scan and used to adjust the operating parameters of RF system 30 or gradient system 28, or to control the view order in which k-space is sampled.

In the exemplary embodiment, data processing server 24 receives MR data from data acquisition server 22 and processes it in accordance with instructions downloaded from workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by data processing server 24 are conveyed back to, and stored at, workstation 12. In some embodiments, real-time images are stored in a database memory cache (not shown in FIG. 1), from which they may be output to operator display 14 or a display 46 that is located near magnet assembly 34 for use by attending physicians. Batch mode images or selected real time images may be stored in a host database on disc storage 48 or on a cloud. When such images have been reconstructed and transferred to storage, data processing server 24 notifies data store server 26. workstation 12 may be used by an operator to archive the images, produce films, or send the images via a network to other facilities.

In 2D MRI, images are acquired by slice. For each slice, a slice is selected by a slice-selective gradient, an excitation RF pulse (or excitation pulse for short) is applied to excite the slice, where spins or protons in the slice are excited by the excitation pulse. An imaging pulse sequence is applied to sample the k-space and acquire MR signals. In MR, a pulse sequence is a sequence of RF pulses, gradient pulses, and data acquisition applied by MR system 10 in acquiring MR signals. In some pulse sequences such as an echo planar imaging sequence or fast spin echo (FSE) sequence, multiple kx lines in the kx-ky plane corresponding to the slice or even the entire kx-ky plane is acquired after one excitation RF pulse. In some pulse sequences such as spin echo or gradient echo sequences, a kx line at certain ky in the kx-ky plane is acquired after one excitation RF pulse. To scan through the kx-ky plane, phase-encoding gradients are changed to acquire all of the needed kx lines in the kx-ky plane. Among the 2D pulse sequences, FSE provides an optimal combination of image quality and speed. The process of excitation and sampling the kx-ky plane is repeated for the number of slices to be acquired. Therefore, it is desirable to excite and acquire multiple slices at once, greatly reducing the scan time.

To increase signal-to-noise ratio (SNR), multiple acquisitions, where the number of acquisitions (NEX) is greater than 1, are applied. In conventional multiple acquisition, a plurality of slices are acquired multiple times. The increase in SNR is approximately proportional to a square root of the NEX. Multi-NEX is often applied to increase SNR.

Methods of simultaneous multi-slice (SMS) acquisition also repeats acquisitions multiple times. As used herein, SMS acquisition is excitation of multiple slices by one excitation RF pulse and the MR signals from the multiple slices are acquired at the same time by scanning through the k space and receiving the scanned k-space data of the multiple slices. Different from multi-NEX acquisition, in SMS acquisition, multiple slices are excited and acquired in one acquisition. Because signals from the multiple slices are mixed together, multiple acquisitions are applied in order to derive or decode images or MR signals from individual slices.

In the known SMS method of multi-band method, multiple slices that are far apart from one another are excited and acquired at once and the MR signals from individual slices are resolved using coil sensitivity maps from multi-channel coils. Besides the requirement of multi-channel coils, multi-band also drastically increases specific absorption ratio (SAR) of pulse sequences having refocusing pulses. SAR is a measure of the amount of power deposited by an RF field in tissue. An excitation pulse rotates the magnetization of the slice by a flip angle, which is 90° or less. A refocusing RF pulse rotates the magnetization typically by 180°, where the pulse duration is longer or the amplitude of the pulse is higher than the excitation pulse and therefore a refocusing pulse is a major contributor to the SAR of the pulse sequence. In multi-band SMS method, because the slices must be far apart such that the coil sensitivity maps do not overlap and are suitable for decoding MR signals from individual slices, multiple refocusing pulses are required to refocus the signals from the multiple slices. As a result, SAR drastically increases in multi-band SMS method for spin echo types of sequences such as FSE. Further, the multiple slices in multi-band SMS are required to be parallel to one another, rendering the method unsuitable for imaging anatomy having curvatures such as the spinal cord. As described above, to select a slice, a slice-selective gradient is applied at the same time as the RF pulse. When selecting parallel slices at the same time, the same slice-selective gradient is used. Selecting slices not parallel to one another requires different slice-selective gradients for different slices, which cannot be provided by an MR system. As a result, multi-band SMS methods are not suitable for imaging the spinal cord.

In another known SMS method of a Hadamard method, the number of slices simultaneously excited and acquired is limited to a power of two, such as 2, 4, or 8. Because of the limit of RF amplifiers, the number of multiple slices may be limited to 2. Further increase from 2 to 4 or from 4 to 8 increases the demand on the MR system drastically, rendering SMS acquisition of 4 or 8 slices using the Hadamard method difficult to achieve.

In yet another known SMS method of a phase-offset multiplanar (POMP) method, two or more slices, typically two, are excited simultaneously. In order to decode the MR signals of different slices, the field of view (FOV) in the phase encoding direction is doubled or increased by a factor equal to the number of slices, limiting the application of the POMP method.

Systems and methods described herein provide SMS acquisition of multiple slices that overcome the above-described problems in known SMS methods. The number of slices of the SMS schemes described herein is not limited to a power of two. The number of slices simultaneously excited and acquired may be referred to as an SMS factor. The number slices may be three, five, six, or seven. For spin echo type sequences, the same single refocusing pulse is applied to refocus the spins in the multiple slices. Because one single refocusing pulse is applied, the SMS acquisition described herein does not drastically increase SAR of the pulse sequences. Consecutive slices and/or nonplanar slices, where one of the slices is not parallel to or has a different angle from another one of the slices, may be imaged simultaneously, broadening the application of the SMS acquisition. The MR signals of individual slices may be derived by algebraic computations of the MR signals from the multiple SMS acquisitions, simplifying the decoding computation. Algebraic computations are operations such as addition, subtraction, multiplication, or division. The systems and methods described herein increase the scanning speed by acquiring multiple slices simultaneously, as well as increasing the SNR of the images from the repeated acquisitions, rendering the SMS schemes described herein advantageous in systems or applications that have a low SNR or are relatively slow such as low SNR systems/applications and/or diffusion applications. For example, in a system with low RF amplifier power specification, the system may not have local RF coils or multi-channel RF coils and therefore the overall SNR is low, because local RF coils or multi-channel RF coils may be placed close to the subject and therefore have a relatively high SNR. In another example, in providing optimal spatial coverage for pelvic or abdominal imaging, a body RF coil is used, instead of local RF coils or multi-channel RF coils, and therefore the SNR is relatively low. In one more example, applications such as prostate diffusion have relatively low SNR because of high resolution and/or inherent low SNR in a 2D selective excitation. The SMS schemes described herein are used to increase the SNR, as well as the scanning speed.

Figure 2A:
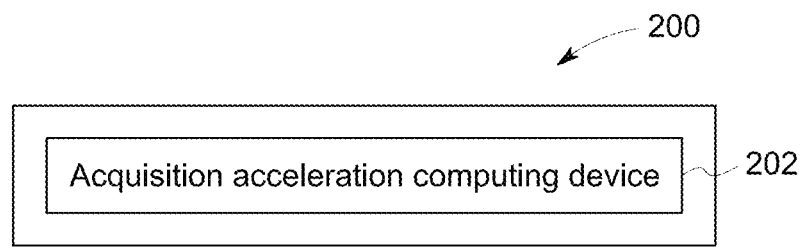
FIG. 2A is a schematic diagram of an exemplary acquisition acceleration system.

FIG. 2A is a schematic diagram of an exemplary acquisition acceleration system 200. In the exemplary embodiment, system 200 includes an acquisition acceleration computing device 202 configured to image a plurality of slices simultaneously. The acquisition acceleration computing device 202 may be included in workstation 12 of MRI system 10, or may be included in a separate computing device that is in communication with workstation 12, through wired or wireless communication. In one example, acquisition acceleration computing device 202 is a server computing device, and may be cloud-based. In some embodiments, acquisition acceleration computing device 202 is a separate computing device from workstation 12 and receives MR images acquired by workstation 12 through a portable storage device, such as a flash drive or a thumb drive.

Figure 2B:
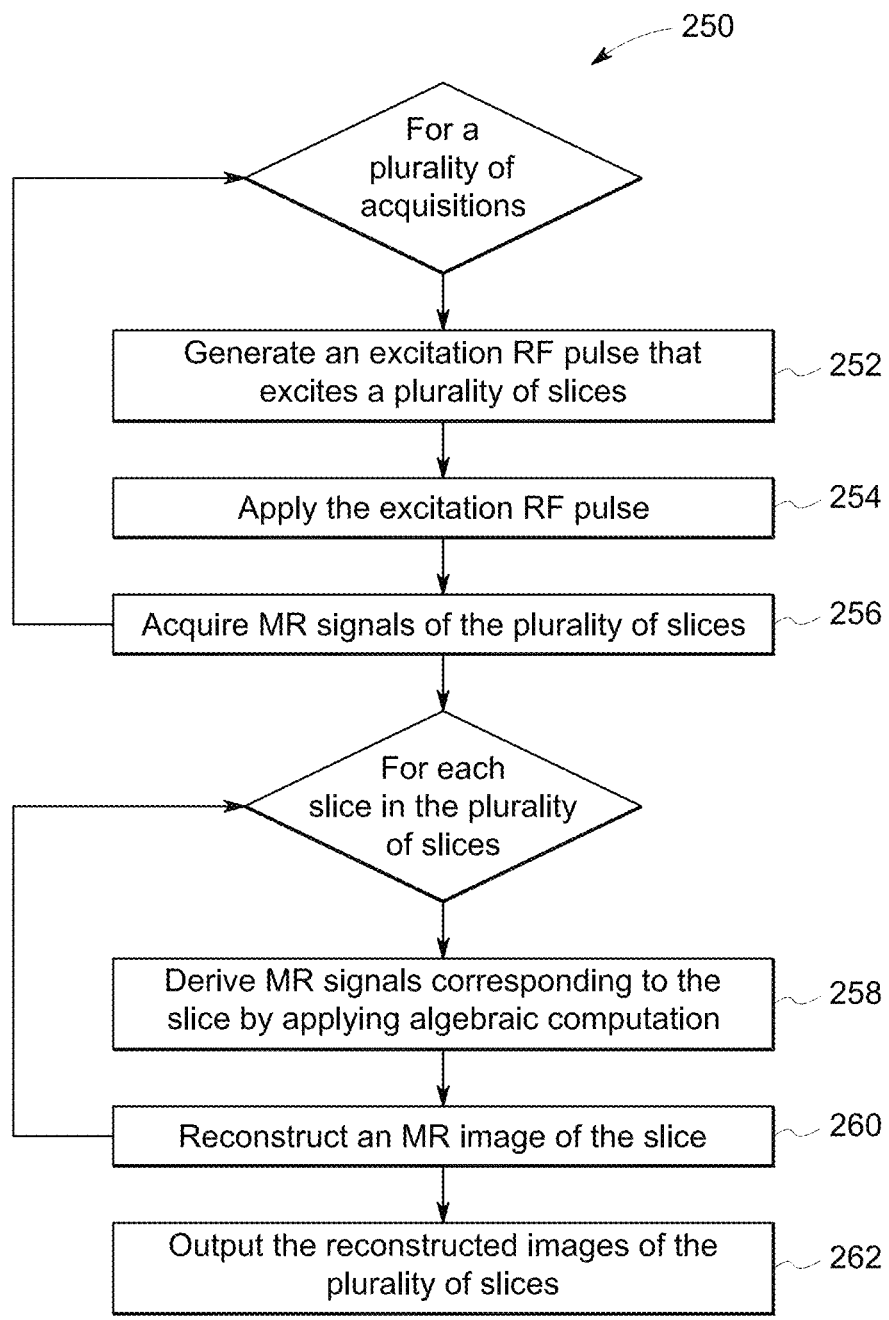
FIG. 2B is a flow chart of an exemplary method of acquisition acceleration.

FIG. 2B is a flow chart of an exemplary method 250 of acquisition acceleration. Method 250 may be implemented using acquisition acceleration computing device 202. In the exemplary embodiment, method 250 includes generating 252 an excitation RF pulse that excites a plurality of slices. The number of slices in the plurality of slices are not a power of 2 or not equal to $2^n$ with n as an integer. For example, the number of slices is 3, 5, 6, or 7. Generating 252 an excitation RF pulse further includes modulating a base excitation RF pulse with a modulation function. Method 250 further includes applying 254 the excitation RF pulse to a subject by the MR system. Method 250 also includes acquiring 256 MR signals of the plurality of slices. Generating 252, applying 254, and acquiring 256 are repeated for a plurality of times equal to the number of slices. The modulation function is different each time.

In the exemplary embodiment, method 250 includes for each slice in the plurality of slices, deriving 258 MR signals corresponding to the slice by applying algebraic computations on MR signals of the plurality of slices acquired at the plurality of acquisitions, and reconstructing 260 an MR image of the slice based on the MR signals corresponding to the slice. Method 250 further includes outputting 262 the reconstructed images of the plurality of slices.

In some embodiments, an MR image is reconstructed based on the MR signals of the plurality of slices, instead of deriving or decoding 258 MR signals for an individual slice and reconstructing 260 an MR image based on the MR signals for the individual slice. In other words, combined MR images of the multiple slices are reconstructed and MR images of individual slices are decoded from the combined MR images. The MR images of individual slices are decoded based on the MR images of multiple slices using the same algebraic computations as in decoding 258 MR signals corresponding to the slice from the MR signals from the multiple acquisitions.

In the exemplary embodiment, multiple slices are excited simultaneously in each acquisition. The MR signals acquired from each acquisition are algebraic combinations of MR signals of individual slices. In one example, MR signals from each acquisition are additions or subtractions of the MR signals from individual slices. Between acquisitions, the excitation pulse is modulated by a different modulation function such that the MR signals from each acquisition are different combinations of the MR signals from individual slices. As a result, the MR signals from each slice are decoded by algebraic computations of the MR signals from individual acquisitions.

In the exemplary embodiment, MR signals S1-S8 from each acquisition are the MR signals A-H from individual slices multiplied by a matrix 302. For example, S1 denotes the MR signals acquired from the first acquisition, which are additions and/or subtractions of MR signals A-H from individual slices. FIGS. 3A-3E show an exemplary relationship between MR signals from each acquisition S1-S8 and MR signals A-H from individual slices and the relationship being used to derive modulation functions to realize this relationship. When the number of slices is a power of two, the matrix is a Hadamard matrix. In a Hadamard matrix, the entries in the matrix are 1 or −1. A Hadamard matrix is a square matrix with an order in a power of two, e.g., 2, 4, or 8. A Hadamard matrix is generated by the following rule:

$$(2^{k+1}) = \begin{pmatrix} (2^k) & (2^k) \\ (2^k) & (2^k)^* \end{pmatrix},$$

where $(2^{k+1})$ is derived by joining the elements of submatrices, and $(2^k)^*$ denotes a matrix where the signs of entries in the matrix are reverted. For example, $$(2^1) = \begin{pmatrix} 1 & 1 \\ 1 & -1 \end{pmatrix}, (2^2) = \begin{pmatrix} 1 & 1 & 1 & 1 \\ 1 & -1 & 1 & -1 \\ 1 & 1 & -1 & -1 \\ 1 & -1 & -1 & 1 \end{pmatrix}.$$

In the exemplary embodiment, matrix 302 is Hadamard-like, where the entries in the matrix are 1 or −1, but the order of matrix 302 is not a power of two. Instead, the order of matrix 302 may be 3, 5, 6, or 7. As described above, Hadamard encoding limits the number of slices to a power to 2, which place constrains in expanding an SMS application from 2 to 4 or from 4 to 8, because of the hardware limits in MR system 10. In contrast, the systems and methods described herein do not limit the number of slices to a power of 2, allowing incremental expansion of SMS acquisition from 2 to 3 or from 4 to 5, 6, or 7. FIGS. 3B-3E show matrix 302-3, 302-5, 302-6, 302-7 when the number of slices is 3, 5, 6, or 7 respectively. Using matrix 302-3 as an example, A, B, C are MR signals of slice A, B, or C, respectively, and S1-S3 represent MR signals of the three slices acquired in the first, second, or third acquisition, respectively. For simplicity in description, an alphabet is used to represent an individual slice and the MR signals of the individual slice. MR signals S1 from the first acquisition is a sum of MR signals A, B, and C from each slice. MR signals S2 from the second acquisition is MR signals A from slice A being subtracted by MR signals B from slice B and by MR signals C from slice C. MR signals S3 from the third acquisition is the sum of MR signals A of slice A and MR signals B of slice being B being subtracted by MR signals C of slice C. That is, $$S1 = A+B+C$$

$$S2 = A-B-C,$$

$$S3 = A+B-C \quad (3)$$

Eq. (3) is a linear equation. MR signals A, B, or C of individual slices may be derived by algebraic computation on MR signals S1, S2, or S3 of the multiple acquisitions. For example, by solving the above Eq. (3), MR signals A, B, or C of individual slices are:

$$S1+S2 = 2A$$

$$S1-S3 = 2C.$$

$$S3-S2 = 2B \quad (4)$$

The acquisition is repeated three times and the signals increase by two fold (see Eq. (4)). As a result, the effective NEX is 2. As used herein, an effective NEX is the number of conventional NEX that has an equivalent SNR increase.

In the exemplary embodiment, in order to achieve the linear relationship of MR signals S1-S3 of different acquisitions with MR signals A-C of individual slices, the excitation pulse is generated as a base excitation RF pulse RF1 being modulated by a different modulation function RF-mod during a different acquisition. The modulation is achieved by multiplying base excitation RF pulse RF1 with the modulation function, where the excitation pulse is product of base excitation RF pulse RF1 multiplied by modulation function RF-mod. Base excitation RF pulse RF1 is an excitation RF pulse for selecting a single slice. The modulation function for each acquisition is derived based on matrix 302. The modulation function includes a cosine function, a sine function, or a combination of both. In one example, the cosine function or the sine function is a function of $\omega_0$. $\omega_0$ is the resonance frequency difference or frequency offset between the primary slice and the next co-excited slice. A primary slice is the centrally located co-excited slice if the SMS factor is an odd number or the center of co-excited slices if the SMS factor is an even number. For example, if the SMS factor is 3, the primary slice is slice 2 and the next co-cited slice is slice 1 or slice 3. If the SMS factor is 6, the primary slice is the center of the 6 slices and the next co-excited slice is slice 3 or 4. The frequency difference is generated by a combination of the RF excitation bandwidth and slice selection gradient. The modulation function may include a complex exponential function of $e^{i\omega t}$, where $\omega$ may be referred to as a modulation frequency and is set as different values for different slices. In one example, for slice B, $\omega$ is set to zero, while for slice A $\omega$ is set to $\omega_0$ and for slice C $\omega$ is set to $-\omega_0$ (see FIG. 3B). By multiplying the corresponding row in Hadamard-like matrix 302-3 with the modulation matrix $[e^{i\omega_0 t} 0 e^{-i\omega_0 t}]$, modulation functions RF-mod for individual acquisitions are derived. As a result, modulation functions RF-mod for individual acquisitions are as follows:

$$RF\text{-mod } 1 = 1*e^{i\omega_0 t} + 1*e(0) + 1*e^{-i\omega_0 t} = 1 + 2\cos(\omega_0 t)$$

$$RF\text{-mod } 2 = 1*e^{i\omega_0 t} - 1*e(0) - 1*e^{-i\omega_0 t} = -1 + 2i\sin(\omega_0 t).$$

$$RF\text{-mod } 3 = 1*e^{i\omega_0 t} + 1*e(0) - 1*e^{-i\omega_0 t} = 1 + 2i\sin(\omega_0 t) \quad (5)$$

In Eq. (5), the signs before 1 are the same as the corresponding entries in matrix 302-3. Matrix 302-3 is the first 3×3 entries of the 8×8 Hadamard matrix 301 (see FIG. 3A).

FIG. 3C shows an exemplary matrix 302-5. In the exemplary embodiment, five slices are excited and acquired simultaneously. Matrix 302-5 includes first 5×5 entries of Hadamard matrix 301 (see FIG. 3A). Five acquisitions are applied with the base RF excitation pulse being modulated by a different modulation function for each acquisition. The modulation frequency ω in the modulation function is set as $3\omega_0$, $\omega_0$, 0, $-\omega_0$, $-3\omega_0$, for slices A-E, respectively. By multiplying the corresponding row in Hadamard-like matrix 302-5 with the modulation matrix $[e^{i3\omega_0 t} e^{i\omega_0 t} 0 e^{-i\omega_0 t} e^{-i3\omega_0 t}]$, modulation functions RF-mod for individual acquisitions are derived. The MR signals A-E for individual slices are derived by solving the linear equation between MR signals S1-S5 from individual acquisitions and MR signals A-E from individual slices, expressed as matrix 302-5, where MR signals S1-S5 are MR signals A-E from individual slices multiplied by a corresponding row in matrix 302-5. For example, S1=A+B+C+D+E. The number of acquisition is five and the effective NEX is 4, where the SNR increase is the same as 4 NEX 4 in conventional acquisitions.

FIG. 3D shows an exemplary matrix 302-6. In the exemplary embodiment, six slices are excited and acquired simultaneously. Matrix 302-6 includes first 6×6 entries of Hadamard matrix 301 (see FIG. 3A). Six acquisitions are applied with the RF base excitation pulse being modulated by a different modulation function for each acquisition. The modulation frequency ω in the modulation function is set as $5\omega_0$, $3\omega_0$, $\omega_0$, $-\omega_0$, $-3\omega_0$, and $-5\omega_0$ for slices A-F, respectively. By multiplying the corresponding row in Hadamard-like matrix 302-6 with the modulation matrix $[e^{i5\omega_0 t} e^{i3\omega_0 t} e^{i\omega_0 t} e^{-i\omega_0 t} e^{-i3\omega_0 t} e^{-i5\omega_0 t}]$ modulation functions RF-mod for individual acquisitions are derived. The MR signals A-F for individual slices are derived by solving the linear equation between MR signals S1-S6 from individual acquisitions and MR signals A-F from individual slices, as expressed by matrix 302-6. The number of acquisitions is six and the effective NEX is 4.

Figures 3E, 4:
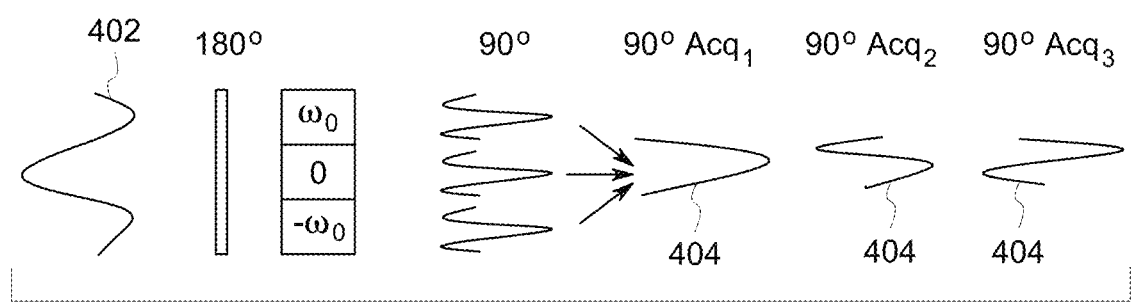
FIG. 3E shows exemplary relationship when the SMS factor is seven.
FIG. 4 is a schematic diagram of radio frequency (RF) pulses in an exemplary SMS scheme.

FIG. 3E shows an exemplary matrix 302-7. In the exemplary embodiment, seven slices are excited and acquired simultaneously. Matrix 302-7 includes first 7×7 entries of Hadamard matrix 301 (see FIG. 3A). Seven acquisitions are applied with the RF base excitation pulse being modulated by a different modulation function for each acquisition. The modulation frequency ω in the modulation function is set as $5\omega_0$, $3\omega_0$, $\omega_0$, 0, $-\omega_0$, $-3\omega_0$, and $-5\omega_0$ for slices A-G, respectively. By multiplying the corresponding row in Hadamard-like matrix 302-7 with the modulation matrix $[e^{i5\omega_0 t} e^{i3\omega_0 t} e^{i\omega_0 t} 0 e^{-i\omega_0 t} e^{-i3\omega_0 t} e^{-i5\omega_0 t}]$, modulation functions RF-mod for individual acquisitions are derived. The MR signals A-G for individual slices are derived by solving the linear equation between MR signals S1-S7 from individual acquisitions and MR signals A-G from individual slices, expressed by matrix 302-7, The number of acquisitions is seven and the effective NEX is 4.

The SMS schemes described herein are not limited to SMS factors of 3, 5, 6, and 7 as described above. The SMS schemes described herein may be similarly applied to other SMS factors, such as 9, 10, and so on.

FIG. 4 is a schematic diagram showing excitation RF pulses 404 and a refocusing pulse 402 when the number of SMS slices is three. In the exemplary embodiment, to simultaneously excite and acquire three slices, the excitation pulse is a base excitation RF pulse multiplied by a modulation function. Because the modulation function is different for a different acquisition, the excitation pulse 404 for each acquisition is different. In spin-echo like sequences, a refocusing pulse 402 is applied to refocus spins in the excited three slices. Unlike excitation pulse 404, refocusing pulse 402 remains the same for each acquisition and is not additionally modulated. Refocusing pulse 402 of the original pulse sequence, such as FSE, may be used.

The simultaneously acquired slices may be consecutive, where the slices are next to one another or have a small gap that is less than the slice thickness of an individual slice placed between neighboring slices. Alternatively, the SMS slices are non-consecutive, where the gap between neighboring slices is more than the slice thickness of an individual slice. The slice-selective gradient corresponding to excitation pulse 404 and refocusing pulse 402 is a gradient that covers a slab including the SMS slices. For example, if the number of SMS slices is five, the slice-selective gradient covers the slab that includes the five slices and the gaps between the five slices if gaps are included. In contrast, in known multi-band SMS methods, the SMS slices need to be separate from one another in order to have distinct coil sensitivity maps to decode MR signals of individual slices.

Because the systems and methods described herein do not place additional constraints on slice-selective gradient to accomplish simultaneous multi-slice excitation and acquisition, applications of the systems and methods described herein are not limited by the angles of slices. An angle of the slice is the angle of the slice relative to a read-out direction in a scout image during imaging location prescription. For example, in imaging the spinal cord, for clinical applications, at least some of the slices used to cover the spinal cord are desirable to have different angles or not necessarily parallel to one another such that the acquired images follow the curvature of the spinal cord. The slice-selective gradient for excitation RF pulse 404 and/or refocusing pulse 402 is a gradient that covers the slab including the slices. In contrast, in known multi-band SMS methods, because the slices must be spaced apart from one another and only one set of slice-selective gradients may be applied at one time, known multi-band SMS methods are not suitable in simultaneously acquiring non-parallel slices.

In some embodiments, a group of slices are used to image the spinal cord, with each group having a plurality of slices. Each intervertebral disc may be imaged by one of the groups. The angle of at least one group may be different from another group in the plurality of groups. An angle of a group is the angle of the slices in the group. As a result, the intervertebral discs are imaged by a group of slices, with the groups of slices having angles that follow the curvature of the spinal cord. In one example, the number of slices in the groups are not the same, where at least one group has a different number of slices than another group. As such, the slice coverage for each intervertebral disc may vary to accommodate the size of the anatomy.

The systems and methods described herein increase the image acquisition speed by simultaneously acquiring multiple slices as well as increase SNR of the images due to the effective increase in NEX from the multiple acquisitions. For example, when the number of SMS slices is three, the decrease in scan time is approximately three times. In the meantime, the effective NEX is two and therefore the increase in SNR is approximately $\sqrt{2}$. Accordingly, the systems and methods described herein are advantageous in MR systems and applications, where the SNR is traditionally low.

The SMS methods described herein are not limited by system configurations, and may be applied with a body RF coil or multi-channel RF coils. For example, if only a body coil is used, multi-band SMS methods are not an option because multi-band SMS methods require the MR system having a multi-channel coil. Further, unlike multi-band SMS methods, where the SMS factor is limited by a geometry factor or g-factor specific to a multi-channel coil, the SMS factor in the SMS methods described herein is not affected by the g-factor, thereby broadening the applications of the SMS methods described herein in a system having a multi-channel coil. In addition, increasing SMS factors from 2 to 4 or from 4 to 8 as required by a Hadamard SMS method may be challenging for the system due to hardware constraints. Accordingly, the systems and methods described herein are advantageous than other SMS methods.

In another example, in applications where fat suppression/saturation pulses are applied, the SNR is reduced from the suppression of fat signals. SMS schemes described herein may be used to increase the SNR without penalty of increase in scan time. In some embodiments, the SMS schemes may be applied to the fat saturation pulse such that the fat saturation pulse simultaneously saturates signals from multiples slices (e.g., consecutive slices). As a result, the efficiency of the fat saturation and/preparation process is increased. In one more example, diffusion weighted imaging has a relatively long scan time due to the application of diffusion-weighting gradients and low SNR from diffusion-weighting. With the increase in scanning speed using the SMS schemes described herein, more slices and/or diffusion-weighting gradients at more b-values or directions may be applied within the same scan time to acquire images having increased SNRs. Further, because multiple slices are simultaneously acquired, less diffusion-weighting gradients are used than conventional diffusion-weighted imaging or diffusion tensor imaging, reducing gradient heating. As such, diffusion-weighted imaging (DWI) and diffusion tensor imaging, which requires more diffusion-weighting directions than DWI, are available in all systems and/or cover an increased area in the subject.

In MR systems, to improve SNR, the bandwidth of the receiver may be reduced. As a result, the number of slices allowed in one acquisition is reduced. The SMS schemes described herein allow SNR to be improved by reducing the bandwidth without losing acquired slices.

The SMS schemes described herein do not require modification of refocusing pulses for simultaneous excitation. As described above, refocusing pulses are the major contributor to SAR. As a result, the SMS schemes described herein do not incur significant increase in SAR. Further, because the RF energy is not significantly increased from SMS acquisitions, RF heating on metal implants, such as pacemakers, stimulators, or prosthetic devices, is not significantly increased by the SMS scheme described herein, broadening the applications of MR system 10.

In some regions such as cardiac or prostate regions, if a multi-channel system is used, coil sensitivity differences in the regions among coils are not significant enough to decode multiple slices, rendering multi-band SMS schemes unsuitable in cardiac or prostate imaging. Cardiac or prostate imaging is often performed while the subject is holding breath, in order to reduce respiratory motion. For some subjects, holding breath for twenty seconds or more may be difficult. The SMS schemes described herein may be used in cardiac or prostate imaging to reduce scan time such that the breath holding time is reduced.

The SMS schemes are compatible with multi-channel systems. For example, the SMS schemes may be applied to each channel and the MR signals of individual slices are derived based on the signals from individual acquisitions for each channel. Once the MR signals from individual slices are decoded from one another for each channel, the MR signals from channels are further processed such as being combined to generate MR images. In some embodiments, a multi-band excitation pulse is used, where excitation RF pulse 404 includes a multi-band excitation RF pulse that excites non-consecutive slices. For example, excitation RF pulse 404 is further modulated by a multi-band RF modulation function such that excitation RF pulse 404 excites the non-consecutive slices simultaneously. The signals or images of individual slices may be derived or reconstructed by the same algebraic computations as described herein.

2D acquisition is described herein as an example for illustration purposes only. The systems and methods may be applied to 3D acquisitions, where the slice-selective gradients are replaced with slab-encoding gradients to select 3D slabs. Each slab is acquired by a 3D acquisition. The signals or images of individual slabs may be derived or reconstructed by the same algebraic computations as described herein, based on signals or images of the plurality of slabs.

Figure 5:
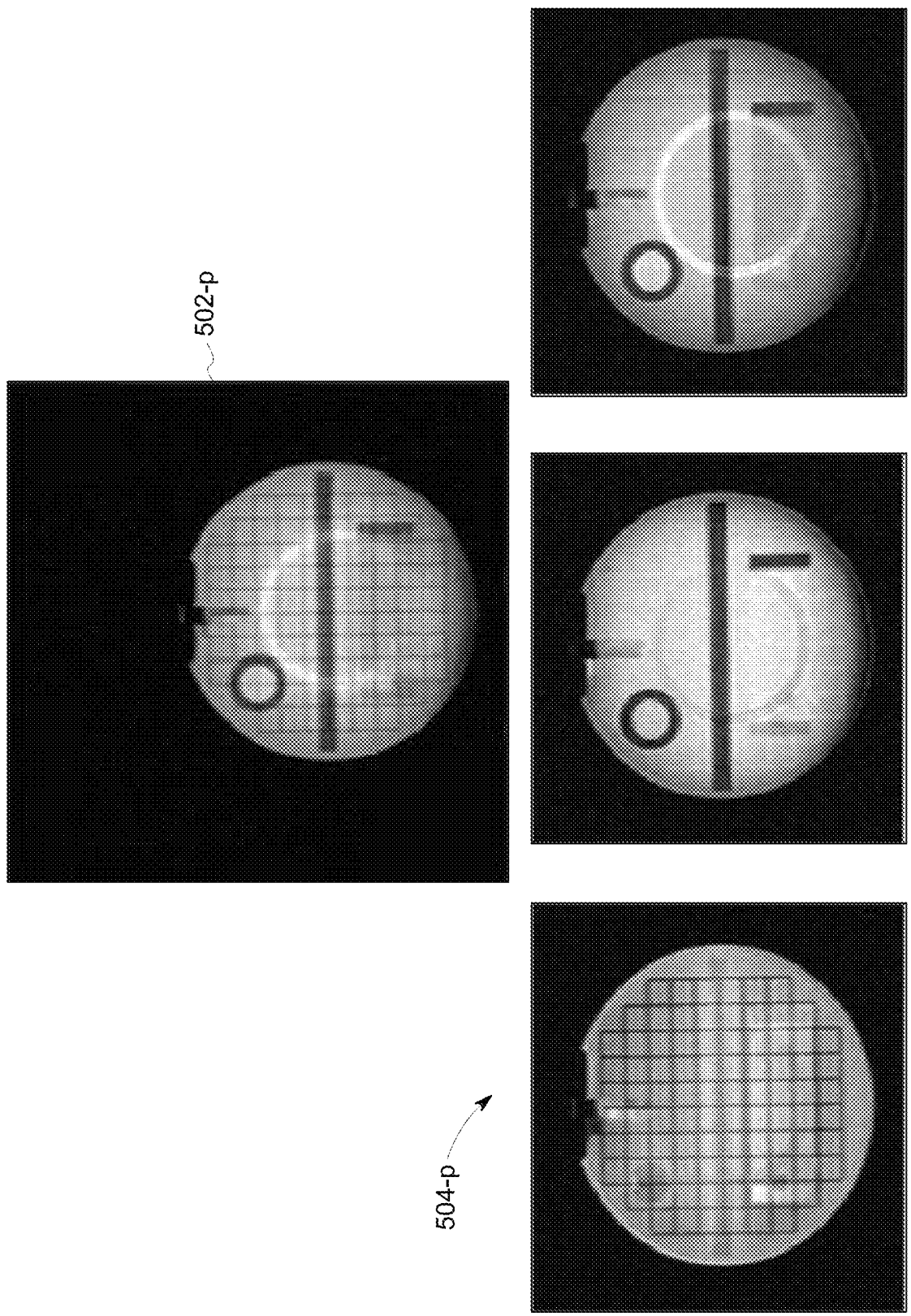
FIG. 5 shows phantom images acquired by an exemplary SMS scheme.
Figure 6:
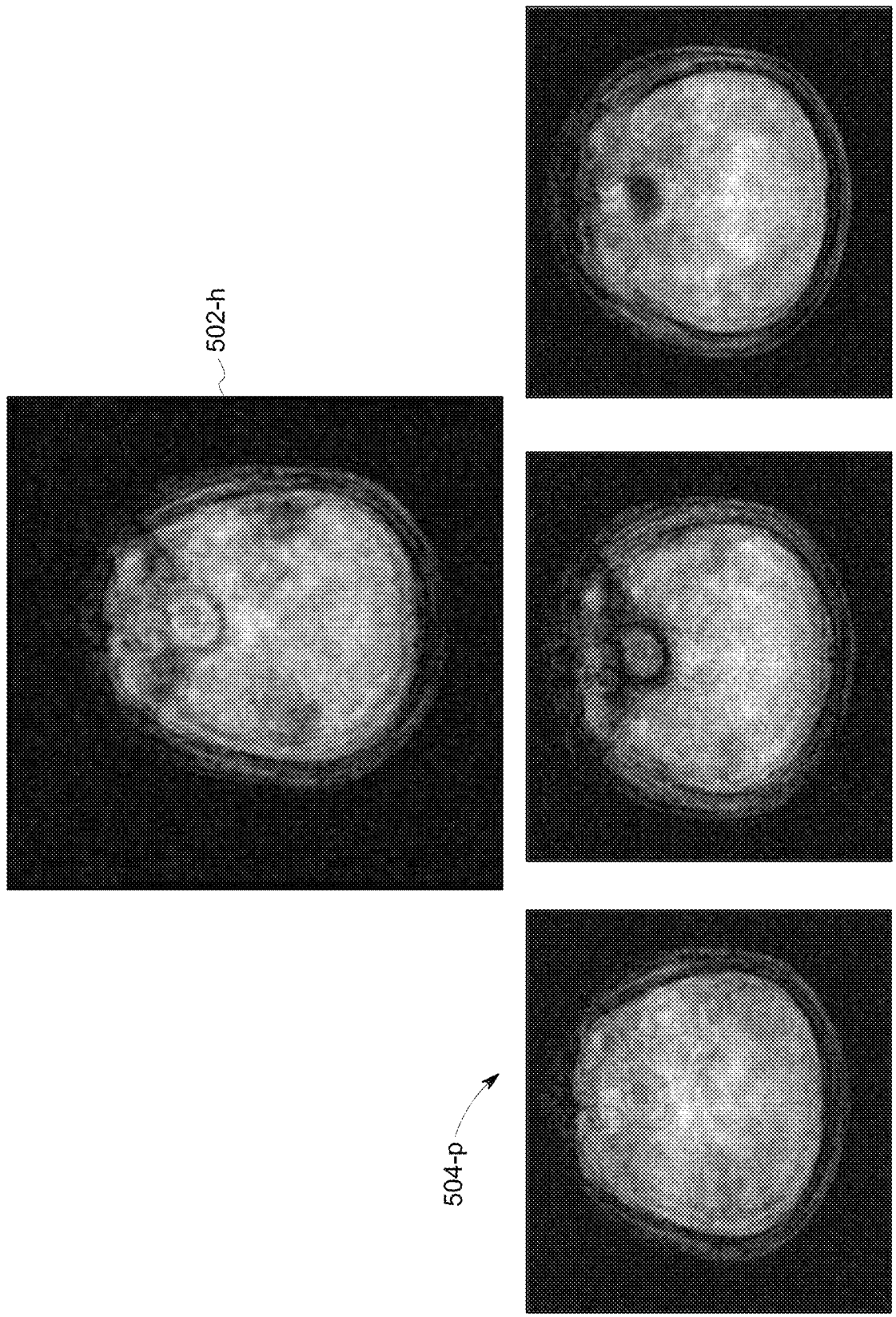
FIG. 6 shows brain images acquired by an exemplary SMS scheme.

FIGS. 5 and 6 show exemplary images acquired using the SMS schemes described herein. FIG. 5 depicts phantom images. FIG. 6 includes images of a head. Both are acquired by a system that has a field strength of 1.5 T using a body coil. The SMS factor is 3. The output from one acquisition is a combined image 502-p, 502-h of the images of the three slices. Images 504-p, 504-h of individual slices are derived by algebraic computations, such as addition or subtraction of the MR signals or images from individual acquisitions.

Figure 7:
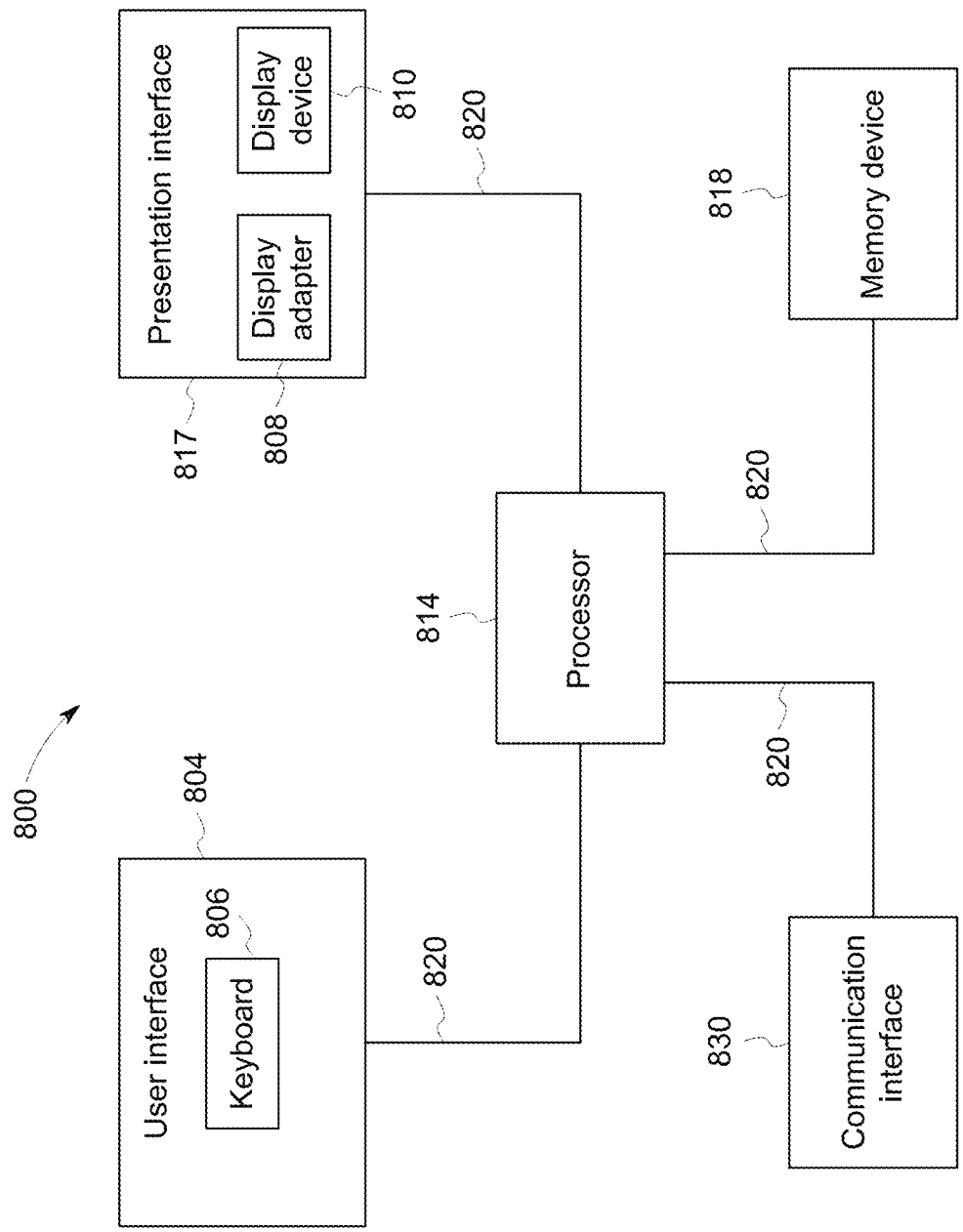
FIG. 7 is a block diagram of an exemplary computing device.

Workstation 12 and acquisition acceleration computing device 202 described herein may be any suitable computing device 800 and software implemented therein. FIG. 7 is a block diagram of an exemplary computing device 800. In the exemplary embodiment, computing device 800 includes a user interface 804 that receives at least one input from a user. User interface 804 may include a keyboard 806 that enables the user to input pertinent information. User interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a presentation interface 817 that presents information, such as input events and/or validation results, to the user. Presentation interface 817 may also include a display adapter 808 that is coupled to at least one display device 810. More specifically, in the exemplary embodiment, display device 810 may be a visual display device, such as a cathode ray tube (CRT), a liquid crystal display (LCD), a light-emitting diode (LED) display, and/or an "electronic ink" display. Alternatively, presentation interface 817 may include an audio output device (e.g., an audio adapter and/or a speaker) and/or a printer.

Computing device 800 also includes a processor 814 and a memory device 818. Processor 814 is coupled to user interface 804, presentation interface 817, and memory device 818 via a system bus 820. In the exemplary embodiment, processor 814 communicates with the user, such as by prompting the user via presentation interface 817 and/or by receiving user inputs via user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, memory device 818 includes one or more devices that enable information, such as executable instructions and/or other data, to be stored and retrieved. Moreover, memory device 818 includes one or more computer readable media, such as, without limitation, dynamic random access memory (DRAM), static random access memory (SRAM), a solid state disk, and/or a hard disk. In the exemplary embodiment, memory device 818 stores, without limitation, application source code, application object code, configuration data, additional input events, application states, assertion statements, validation results, and/or any other type of data. Computing device 800, in the exemplary embodiment, may also include a communication interface 830 that is coupled to processor 814 via system bus 820. Moreover, communication interface 830 is communicatively coupled to data acquisition devices.

In the exemplary embodiment, processor 814 may be programmed by encoding an operation using one or more executable instructions and providing the executable instructions in memory device 818. In the exemplary embodiment, processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Figure 8:
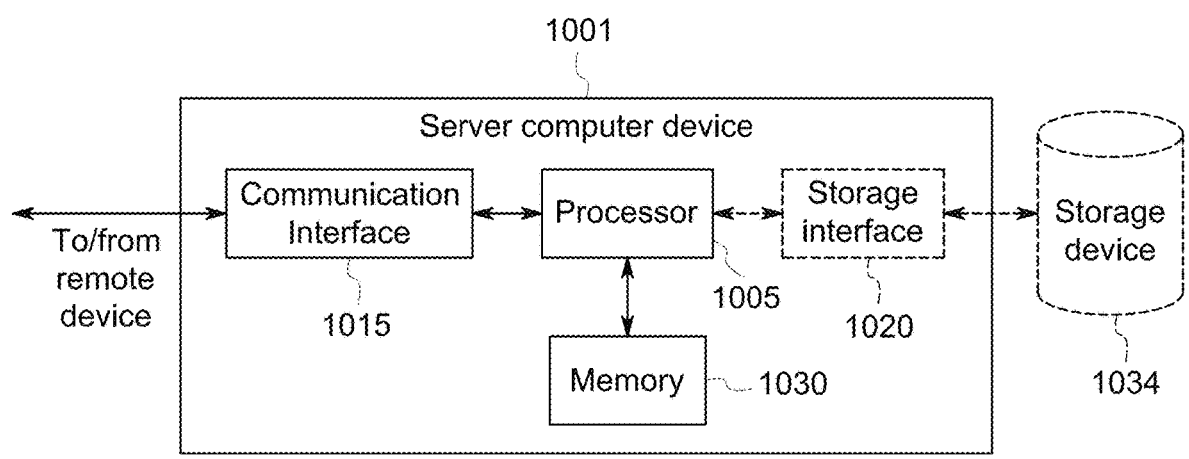
FIG. 8 is a schematic diagram of a server computing device.

FIG. 8 illustrates an exemplary configuration of a server computer device 1001 such as computing device 202. Server computer device 1001 also includes a processor 1005 for executing instructions. Instructions may be stored in a memory area 1030, for example. Processor 1005 may include one or more processing units (e.g., in a multi-core configuration).

Processor 1005 is operatively coupled to a communication interface 1015 such that server computer device 1001 is capable of communicating with a remote device or another server computer device 1001. For example, communication interface 1015 may receive data from workstation 12, via the Internet.

Processor 1005 may also be operatively coupled to a storage device 1034. Storage device 1034 is any computer-operated hardware suitable for storing and/or retrieving data, such as, but not limited to, wavelength changes, temperatures, and strain. In some embodiments, storage device 1034 is integrated in server computer device 1001. For example, server computer device 1001 may include one or more hard disk drives as storage device 1034. In other embodiments, storage device 1034 is external to server computer device 1001 and may be accessed by a plurality of server computer devices 1001. For example, storage device 1034 may include multiple storage units such as hard disks and/or solid state disks in a redundant array of inexpensive disks (RAID) configuration. Storage device 1034 may include a storage area network (SAN) and/or a network attached storage (NAS) system.

In some embodiments, processor 1005 is operatively coupled to storage device 1034 via a storage interface 1020. Storage interface 1020 is any component capable of providing processor 1005 with access to storage device 1034. Storage interface 1020 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 1005 with access to storage device 1034.

At least one technical effect of the systems and methods described herein includes: (a) reduction of scan time via SMS; (b) increase SNR from SMS; (c) an SMS factor of not being a power of 2; (d) SMS acquisition without modification of refocusing pulses; and (e) accelerated acquisition of multiple slices including at least one slice not parallel with another slice.

Exemplary embodiments of systems and methods of acquisition acceleration are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic resonance (MR) acquisition acceleration method, comprising:
for each acquisition of a plurality of acquisitions,
generating an excitation radio frequency (RF) pulse that excites a plurality of slices, wherein a number of slices in the plurality of slices is not a power of two, wherein generating the excitation RF pulse further comprises modulating a base excitation RF pulse with a different modulation function during each acquisition, generating the excitation RF pulse further comprising:
   generating the modulation function for individual acquisitions by:
      multiplying a Hadamard-like matrix with a modulation matrix, the modulation matrix having one row and a number of columns, wherein the number of columns is the same as the number of slices;
   applying, to a subject by an MR system, the excitation RF pulse; and
   acquiring MR signals of the plurality of slices, wherein a number of acquisitions is equal to the number of slices, and MR signals from each acquisition are linear combinations of MR signals of individual slices in the plurality of slices;
reconstructing MR images of the individual slices based on the MR signals from the plurality of acquisitions; and
outputting the reconstructed MR images of the individual slices.

2. The method of claim 1, wherein:
for each slice in the plurality of slices,
   deriving MR signals corresponding to the slice by applying linear computations on MR signals of the plurality of slices from the plurality of acquisitions; and
   reconstructing an MR image of the slice based on the MR signals corresponding to the slice.

3. The method of claim 1, wherein the modulation function includes at least one of a cosine function or a sine function.

4. The method of claim 1, wherein the MR signals of the plurality of slices from the plurality of acquisitions are the MR signals of individual slices multiplied by the Hadamard-like matrix, wherein entries in the Hadamard-like matrix are 1 or −1.

5. The method of claim 4, wherein generating the excitation RF pulse further comprises:
   generating the excitation RF pulse by multiplying the base RF excitation pulse with the modulation function.

6. The method of claim 5, wherein deriving the modulation function further comprises:
   deriving the modulation function by multiplying a row in the Hadamard-like matrix with a complex exponential function.

7. The method of claim 6, wherein the complex exponential function is a function of $\omega_0$, wherein $\omega_0$ is a resonance frequency difference between a primary slice and a next co-excited slice.

8. The method of claim 1, wherein applying the excitation RF pulse further comprises applying a same single RF refocusing pulse that refocuses the plurality of slices, wherein the single RF refocusing pulse is not modulated by the modulation function.

9. The method of claim 1, wherein the plurality of slices are consecutive slices.

10. The method of claim 1, wherein at least one slice in the plurality of slices has a different angle from another slice in the plurality of slices.

11. The method of claim 1, wherein:
generating the excitation RF pulse further comprises generating the RF pulse that excites a plurality of groups of the plurality of slices; and
applying the excitation RF pulse further comprises applying, to a region of the subject including a plurality of intervertebral discs by the MR system, the excitation RF pulse, wherein each of the intervertebral discs is covered by one of the plurality of groups, and at least one group in the plurality of groups has a different angle from another group in the plurality of groups.

12. The method of claim 1, wherein:
generating the excitation RF pulse further comprises generating the RF pulse that excites a plurality of groups of the plurality of slices; and
applying the excitation RF pulse further comprises applying, to a region of the subject including a plurality of intervertebral discs by the MR system, the excitation RF pulse, wherein each of the intervertebral discs is covered by one of the plurality of groups, and at least one group in the plurality of groups has a different number of slices from another group in the plurality of groups.

13. The method of claim 1, wherein the method further comprises using a body RF coil in the plurality of acquisitions.

14. The method of claim 1, wherein the MR system is multi-channeled.

15. The method of claim 1, wherein applying the excitation RF pulse further comprises:
   applying diffusion-weighting gradients.

16. The method of claim 1, wherein applying the excitation RF pulse further comprises:
   applying a fat saturation pulse.

17. The method of claim 16, wherein applying the fat saturation pulse further comprises applying the fat saturation pulse that saturates the plurality of slices.

18. The method of claim 1, wherein generating the excitation RF pulse further comprises generating the excitation RF pulse including a multi-band excitation RF pulse configured to excite non-consecutive slices.

19. The method of claim 1, wherein applying the excitation RF pulse further comprises applying, to a region of the subject that includes a heart or a prostate of the subject by the MR system, the excitation RF pulse while the subject is holding breath.

20. The method of claim 1, wherein the elements of the modulation matrix are functions of $e^{i\omega t}$, wherein $\omega$ is a modulation frequency corresponding to a slice in the number of slices.

21. A magnetic resonance (MR) acquisition acceleration method, comprising:
for each acquisition of a plurality of acquisitions,
   generating an excitation radio frequency (RF) pulse that excites a plurality of slabs, wherein a number of slabs in the plurality of slabs is not a power of two, wherein generating the excitation RF pulse further comprises modulating a base excitation RF pulse with a different modulation function during each acquisition, generating the excitation RF pulse further comprising:
      generating the modulation function for individual acquisitions by:
         multiplying a Hadamard-like matrix with a modulation matrix, the modulation matrix having one row and a number of columns, wherein the number of columns is the same as the number of slabs;
   applying, to a subject by an MR system, the excitation RF pulse; and
   acquiring MR signals of the plurality of slabs, wherein a number of acquisitions is equal to the number of slabs, and MR signals from each acquisition are linear combinations of MR signals of individual slabs in the plurality of slabs;

reconstructing MR images of the individual slabs based on the MR signals from the plurality of acquisitions; and outputting the reconstructed MR images of the individual slabs.

* * * * *